United States Patent [19]

Yamaguchi

[11] Patent Number: 5,736,414
[45] Date of Patent: Apr. 7, 1998

[54] METHOD FOR MANUFACTURING SEMICONDUCTOR DEVICE

[75] Inventor: Naoaki Yamaguchi, Kanagawa, Japan

[73] Assignee: Semiconductor Energy Laboratory Co., Ltd., Kanagawa, Japan

[21] Appl. No.: 501,297

[22] Filed: Jul. 12, 1995

[30] Foreign Application Priority Data

Jul. 14, 1994 [JP] Japan .................................. 6-186263

[51] Int. Cl.$^6$ .................................................. H01L 21/265
[52] U.S. Cl. ................................. 437/21; 437/41; 437/40
[58] Field of Search ................................ 437/21, 71, 20, 437/228 S, 228 SE, 40 GS, 40 TFT, 41 RLD, 41 SW, 41 TFT; 257/66, 72

[56] References Cited

U.S. PATENT DOCUMENTS

| | | | |
|---|---|---|---|
| 4,232,327 | 11/1980 | Hsu | 437/44 |
| 4,468,855 | 9/1984 | Sasaki . | |
| 4,646,426 | 3/1987 | Sasaki . | |
| 4,728,617 | 3/1988 | Woo et al. | 437/44 |
| 4,772,927 | 9/1988 | Saito et al. | 437/21 |
| 5,100,810 | 3/1992 | Yoshimi et al. | 437/21 |
| 5,289,030 | 2/1994 | Yamazaki et al. | 257/57 |
| 5,292,675 | 3/1994 | Kodama et al. | 437/44 |
| 5,308,998 | 5/1994 | Yamazaki et al. | 257/57 |
| 5,403,762 | 4/1995 | Takemura et al. | 437/40 TFT |
| 5,430,320 | 7/1995 | Lee . | |
| 5,468,987 | 11/1995 | Yamazaki et al. | 257/412 |
| 5,474,945 | 12/1995 | Yamazaki et al. | 437/41 TFT |
| 5,492,843 | 2/1996 | Adachi et al. | 437/21 |
| 5,495,121 | 2/1996 | Yamazaki et al. | 257/384 |
| 5,508,209 | 4/1996 | Chang . | |
| 5,521,107 | 5/1996 | Yamazaki et al. | 437/42 |
| 5,523,257 | 6/1996 | Yamazaki et al. | 437/21 |
| 5,561,075 | 10/1996 | Nakazawa . | |
| 5,576,231 | 11/1996 | Konuma et al. . | |
| 5,576,802 | 11/1996 | Yamazaki et al. . | |
| 5,620,905 | 4/1997 | Konuma et al. . | |

FOREIGN PATENT DOCUMENTS

| | | |
|---|---|---|
| 0588370A2 | 3/1994 | European Pat. Off. . |
| 54-70762 | 6/1979 | Japan . |
| 58-23479 | 2/1983 | Japan . |
| 60-55665 | 3/1985 | Japan . |
| 61-224360 | 10/1986 | Japan . |
| 63-178560 | 7/1988 | Japan . |
| 1183853 | 7/1989 | Japan . |
| 2306664 | 12/1990 | Japan . |
| 2307273 | 12/1990 | Japan . |
| 4360580 | 12/1992 | Japan . |
| 5166837 | 7/1993 | Japan . |
| 5275448 | 10/1993 | Japan . |
| 613397 | 1/1994 | Japan . |
| 6-232160 | 8/1994 | Japan ........... 437/21 |
| 6-275648 | 9/1994 | Japan ........... 437/21 |

OTHER PUBLICATIONS

Wolf, "Silicon Processing for the VLSI Era" vol. 3, Copyrigh ©1995 Lattice Press, pp. 608–611.

*Primary Examiner*—George R. Fourson
*Assistant Examiner*—S. Mulpuri
*Attorney, Agent, or Firm*—Sixbey, Friedman, Leedom & Ferguson, P.C.; Gerald J. Ferguson, Jr.; Bradley D. Blanche

[57] ABSTRACT

The aim of the present invention is to obtain a thin-film transistor which has a small OFF current. A film whose main component is aluminum and which will be the gate electrode is formed in an island shape, and a porous oxide layer is formed on its side surfaces by an anodic oxidation process. A source region and a drain region are then formed by performing impurity ion implantation. Further, the aforementioned oxide layer is removed, and lightly doped regions are formed by once again performing impurity ion implantation. In this way it is possible to obtain a construction which has lightly doped regions between the source/drain regions and the channel-forming regions.

11 Claims, 8 Drawing Sheets

IMPURITY ION

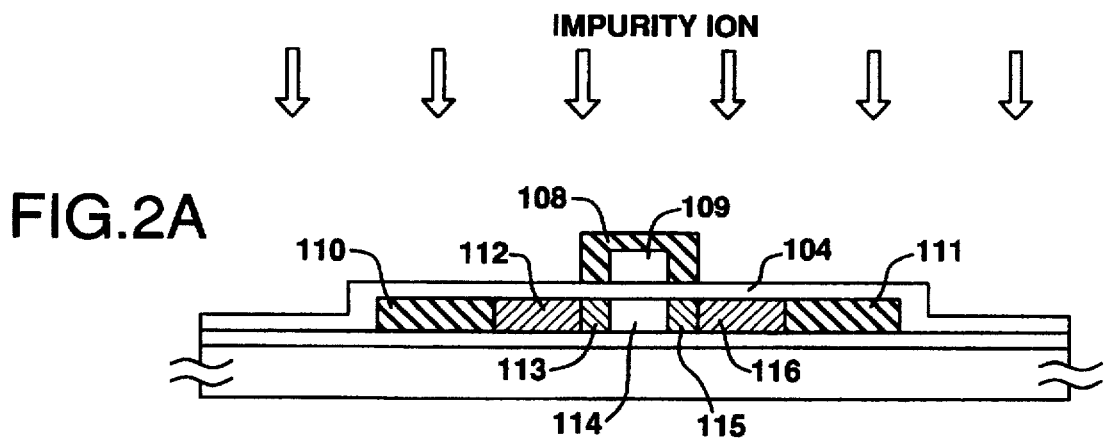
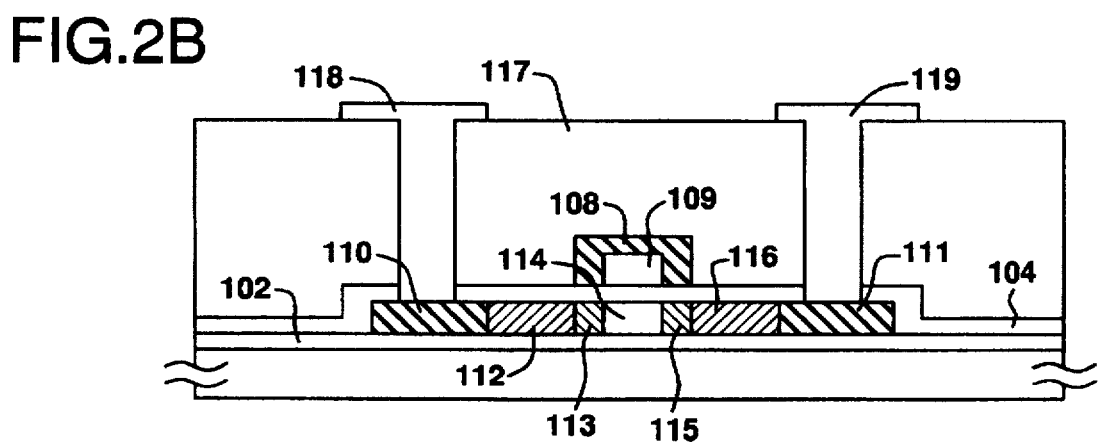
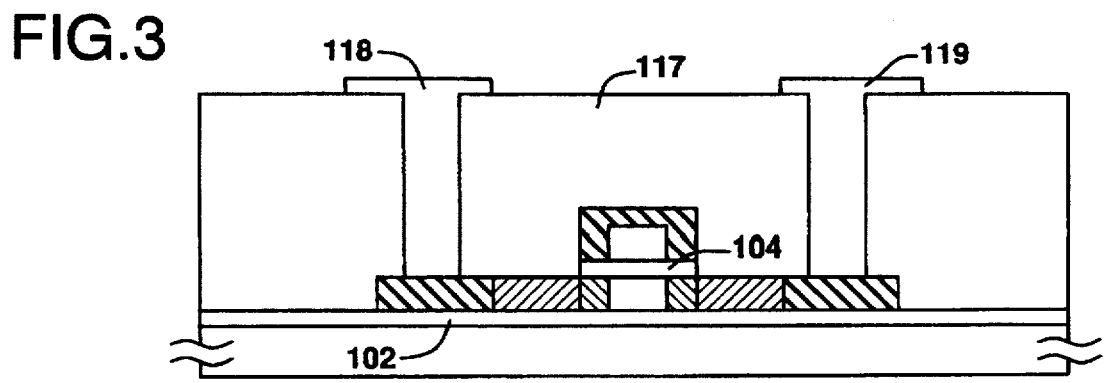

IMPURITY ION

IMPURITY ION

FIG.9A
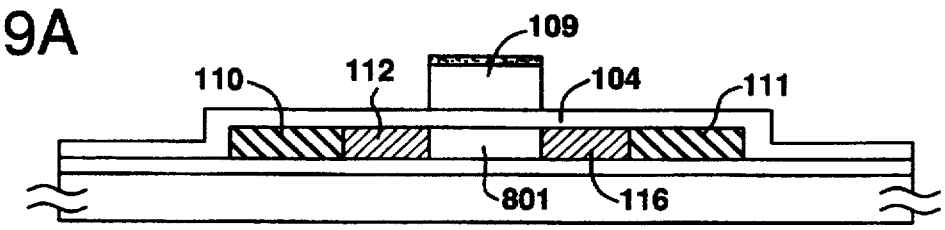
FIG.9B
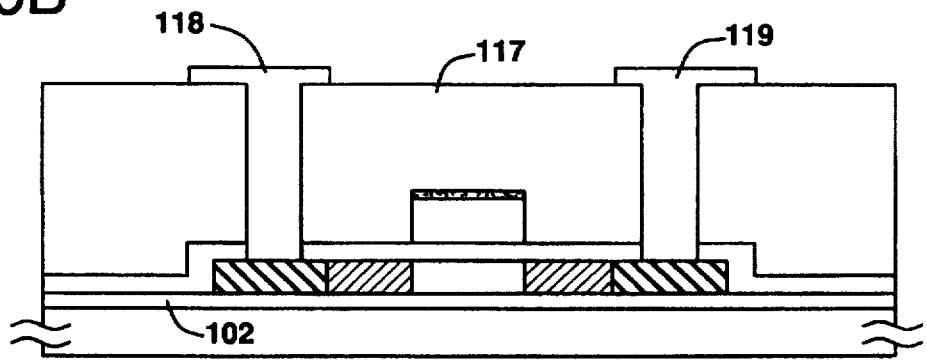

METHOD FOR MANUFACTURING SEMICONDUCTOR DEVICE

BACKGROUND OF THE INVENTION

1. [Field of The Invention]

The present invention relates to a semiconductor device, especially, an insulated gate field effect transistor of a thin film type and a manufacturing method thereof.

2. [Description of The Prior Art]

Thin-film transistors (generally termed TFTs) which employ thin-film semiconductors formed on a substrate which has an insulating surface, such as a glass substrate, are known. These thin-film transistors are used in various types of integrated circuit. There are in particular known examples in which they are arranged at each picture element portion of an active matrix-type liquid crystal display device, and are used for switching the picture element.

Known types of thin-film semiconductor include amorphous silicon films and crystalline silicon films. Amorphous silicon films have the feature that they have excellent productivity since film formation is simple, but there is a problem that their electrical properties are low, and the properties of the resulting thin-film transistors are low. On the other hand, crystalline silicon films have the feature that thin-film transistors which have high properties can be obtained. However, since at present it is not possible to obtain monocrystal silicon films, the resulting films inevitably have a polycrystalline structure or a microcrystalline structure (the general term for these is crystalline silicon films).

In thin-film transistors which employ such crystalline silicon films, the presence of an OFF current (also referred to as a leak current) is a significant problem. The OFF current is a phenomenon in which when an n-channel type thin-film transistor, for example, is in the OFF state, if a negative voltage is applied to the gate electrode, a leak current unintentionally flows between the source and the drain region. With the n-channel type thin-film transistor in the OFF state, if a negative voltage is applied to the gate electrode, the portion of the channel-forming region which is in contact with the gate insulating film becomes a p-type region. Thus if the thin-film semiconductor which constitutes the active layer (in which the source/drain regions and channel-forming regions are formed) is a monocrystal, a pn junction is formed between the source and the drain, and no large current flows between the source and the drain. However, if the thin-film semiconductor constituting the active layer has a polycrystalline structure or a microcrystalline structure then movement of carriers will inevitably occur through grain boundaries due to the high electric field between the drain region and the channel-forming region. As a result, the OFF current is relatively large.

A known technique which is used to reduce the above mentioned OFF current is to use an LDD structure or an offset gate structure. These structures aim to reduce the OFF current by arranging that electric fields do not concentrate at the boundaries between the drain region and the channel-forming region, or in the vicinity thereof.

SUMMARY OF THE INVENTION

According to the research of the inventors it was confirmed that it is possible to reduce the OFF current greatly by fabricating the thin-film transistor whose fabrication process is shown in FIGS. 4A–4D and FIGS. 5A–5B. The thin-film transistor is provided with both offset gate regions and lightly doped regions.

Referring to FIG. 4A, a glass substrate 101 is prepared, and a silicon oxide film 102 is formed on the surface thereof as a buffer film to a thickness of 2000 Å by a sputtering method. An amorphous silicon film is then formed to a thickness of 1000 Å by a reduced-pressure thermal CVD method or a plasma CVD method. The amorphous silicon film is then crystallized by heating or laser light irradiation, and a crystalline silicon film is obtained.

As a method for obtaining this crystalline silicon film, metal elements can be used to promote crystallization of the amorphous silicon film. By using this method, it is possible to convert the amorphous silicon film into a crystalline silicon film by heat treating at 550° C. for approximately 4 hours. The technical advantages are apparent from the fact that Corning 7059 glass substrates which are commonly used as substrates for active matrix type liquid crystal display devices have the problem that they deform or shrink, for example, when heated to 600° C., but these problems can be avoided at a temperature of 550° C.

One or more elements selected from the group of Fe, Co, Ni, Cu, Ru, Rh, Pd, Ag, Os, Ir, Pt, Au can be used as the above mentioned metal element(s). Examples of methods for introducing the metal elements into the amorphous silicon film include methods in which the above mentioned metal elements or a thin film which contains the metal elements is formed on the surface of the amorphous silicon film by a sputtering method, a plasma CVD method or a plasma treatment using electrodes which contain a large amount of the metal elements; and methods in which a solution containing the metal elements is applied to the surface of the amorphous silicon film.

Having obtained the crystalline silicon film, an active layer 103 which comprises the crystalline silicon film is obtained by patterning as shown in FIG. 4A.

After the formation of the active layer 103, a silicon oxide film 104 which functions as a gate insulating film is formed to a thickness of 1000 Å by a plasma CVD method. Further, a film whose main component is aluminum is formed to a thickness of 6000 Å, and patterning is performed to form an island-shaped region 105. A dense oxide film 106 is formed by an anodic oxidation process in which the island-shaped region 105 whose main component is aluminum is used as an anode. (FIG. 4B)

Next, as shown in FIG. 4C, a porous oxide layer 107 is formed, again by an anodic oxidation process. The difference between forming the dense oxide layer and the porous oxide layer can be achieved by selecting the components of the electrolytic solution which is used, and the applied voltage.

Then, in FIG. 4D, the dense oxide film 106 is removed and then another dense oxide layer 108 is formed by anodization. This oxide layer 108 functions as a mask for forming offset gate regions in a subsequent impurity ion implanting process.

Etching is then performed using the porous oxide layer 107, the remaining aluminum portion 109 and the dense oxide film 108 as a mask, to remove the exposed silicon oxide film 104. This etching is performed by vertical anisotropic etching.

Next, in FIG. 5A, the porous oxide layer 107 is removed, and then an impurity ion implantation is performed to form source and drain regions. In this step, the source region 110 and the drain region 111 are formed in a self-aligning manner. Further, offset gate regions 113 and 115 are formed by the use of the oxide layer 108. Further, lightly doped regions 112 and 116 are formed in this process. These lightly doped regions are formed because part of the implanted ions are blocked by the remaining silicon oxide film 104. Further, a channel-forming region 114 is defined in a self-aligning manner.

Finally, in FIG. 5B, an inter-layer insulating film 117 is formed of a silicon oxide film, a hole-making process is then performed, a source electrode 118 and a drain electrode 119 are formed and thus the thin-film transistor is completed.

With the thin-film transistor shown in FIG. 5B, it is possible to prevent the concentration of high electric fields between the channel-forming region 114 and the source region 110, and between the channel-forming region 114 and the drain region 111, because of the presence of the pair of offset gate regions 113 and 115 and the pair of lightly doped regions 112 and 116, and it is thus possible to obtain a thin-film transistor which has a low OFF current.

However, the above described process has a problem when the step shown in FIG. 4D is performed. In the process shown in FIG. 4D, the vertical anisotropic etching is performed by an RIE method, and the exposed silicon oxide film 104 is removed. However, the etching conditions at this time must be accurately controlled in order to remove only the silicon oxide film 104 to avoid the following problems.

That is, when the silicon oxide film 104 is intended to be removed by the vertical anisotropic etching method, the surface of the source region 110 and the drain region 111 will also be etched somewhat, as shown by the reference numeral 500 in FIG. 6. If the source region 110 and the drain region 111 become thinned, holes are likely to be formed in the source, drain regions when the source, drain electrodes are subsequently formed, and this will cause disadvantages such as unsatisfactory contact. Further, the buffer silicon oxide film 102 is also likely to be etched at the same time as shown by the reference numeral 600 in FIG. 7, and a step will be formed on the inter-layer insulating film formed thereon. If a step occurs on the inter-layer insulating film, this causes steps in the wiring which is formed on the inter-layer insulating film at the step portion. These disadvantages are a major cause of variations in the properties of the thin-film transistors, and are a major problem in the mass production of thin-film transistors.

Removing the silicon oxide film 104 by the RIE method in this way in the process shown in FIG. 4D has the problem that it causes variations in the completed thin-film transistors. In particular, if a glass substrate is used as the substrate then the surface of the substrate becomes electrostasticaly unstable, and the accuracy of etching using the RIE method is greatly reduced, and therefore the problem is significant.

Consideration can also be given to performing the process shown in FIG. 4D by wet etching. If wet etching is used, the etching can be provided with selectivity, and this is significant in that it is possible to prevent the etching of the source, drain regions. However, in this case, as shown in FIG. 7, in addition to the buffer silicon oxide film 102 being etched, there is another problem that the etching progresses so as to undercut the active layer as shown by 700. As a result of the etching such as indicated by 700, a step coverage deteriorate when the inter-layer insulating film is subsequently formed. This also causes unsatisfactory or variable properties in the completed thin-film transistor.

On the other hand, when metal elements are used to promote crystallization, there is a problem that the OFF current becomes relatively large due to the effect of the metal elements which are unevenly distributed within the active layer. This further necessitates a construction in which the lightly doped regions are provided as shown in FIG. 5A.

The present invention aims to solve at least one of the items given below.

(1) To obtain a thin-film transistor which has a small OFF current.

(2) To solve problems such as shown in FIG. 6 and FIG. 7 described above.

(3) To obtain a thin-film transistor which has small variation.

In accordance with one aspect of the present invention, a TFT comprises an active layer which includes a pair of lightly doped regions and a pair of offset gate regions, wherein an insulating film is provided to cover substantially the entire surface of the active layer.

FIG. 2B shows a specific example of the above structure. Unless specifically mentioned, the same reference numerals of the drawings show the same or equivalent elements, hereinafter. As shown in FIG. 2B, the insulating film 104 covers substantially the entire surface of the active layer except for the contact portions with wirings. Further, not only silicon oxide, but also silicon nitride or a multi-layer film may be used as the insulating film.

In accordance with another aspect of the present invention, the method of forming a TFT comprises the steps of forming a porous oxide layer on the side surface of a gate electrode, adding impurities into an active layer using the porous oxide layer as a mask, removing the porous oxide layer, and then implanting the same impurity ions into the active layer using the gate electrode as a mask.

FIGS. 1A–1D and FIGS. 2A–2B show an example of the above method. 107 in FIG. 1C is the porous oxide layer which is formed on the side surfaces of the gate electrode 109. It is thus possible to implant impurity ions into the regions 110 and 111 by performing impurity ion implantation in the subsequent step of FIG. 1D.

The porous oxide layer 107 is then removed, and it is possible to form lightly doped regions 112 and 116 by again performing impurity ion implantation, as shown in FIG. 2A, using the gate electrode 109 as a mask (in this case the oxide layer 108 at the periphery thereof also acts as a mask).

The porous oxide layer is formed on the side surfaces of the gate electrode, if a material whose main component is aluminum is used as the gate electrode, by performing anodic oxidation with the material whose main component is aluminum as the anode. In order to form the porous oxide layer, anodic oxidation should be performed using an acidic solution containing one or more of: citric acid, nitric acid, phosphoric acid, chromic acid and sulfuric acid. This porous oxide layer has the feature that the growth distance can be lengthened and easily controlled.

Also, in order to form the dense oxide layer, the anodic oxidation should be performed with the gate electrode as the anode in an ethylene glycol solution containing one or more of: tartaric acid, boric acid or nitric acid. It should be noted that the pH of the anodic solution should be approximately neutral or weak acid. The dense anodic oxide layer has an etching selectivity with respect to the porous anodic oxide layer, that is, it is possible to etch only the porous anodic oxide layer without etching the dense anodic oxide layer.

Accordingly, referring to FIG. 2A, after removing only the porous oxide layer 107 to leave the dense anodic oxide layer 108, the lightly doped regions 112 and 116 are formed by performing impurity ion implantation. The drain side of the lightly doped region (116 in the case in FIG. 2A) is a lightly doped drain (LDD).

Further, because of the presence of the dense oxide 108, it is possible to form offset gate regions 113 and 115 simultaneously.

In accordance with the present invention, the steps do not occur in the active layer and the buffer film at the periphery of the active layer is not etched because the insulating film 104 substantially covers the entire surface of the active layer and the surface of the substrate.

BRIEF DESCRIPTION OF THE DRAWINGS

FIGS. 2A–2B show a manufacturing process of a TFT in accordance with a first embodiment of the present invention;

FIG. 3 is a cross sectional view showing a thin-film transistor in accordance with the second embodiment of the present invention;

FIGS. 9A and 9B show a manufacturing process of a TFT in accordance with a third embodiment of the present invention.

DETAILED DESCRIPTION OF THE PREFERRED EMBODIMENTS

[Embodiment 1]

FIGS. 1A–1D and FIGS. 2A–2B show a manufacturing process of an n-channel type thin film transistor in accordance with the present invention. The thin film transistor of the present embodiment may be applied to liquid crystal display devices, image sensors and other thin-film integrated circuits.

Firstly a silicon oxide film 102 is formed on a glass substrate 101 as a buffer film to a thickness of 2000 Å using a sputtering method or a plasma CVD method. This buffer film blocks the diffusion of impurities from the glass substrate 101. In the present embodiment a glass substrate is used as the substrate by way of example, but a substrate which has an insulated surface such as a quartz substrate or a semiconductor substrate may also be used as the substrate. Further, an insulating film such as an inter-layer insulating film which is formed on an integrated circuit may also be used as a substrate.

An amorphous silicon film is then formed to a thickness of 1000 Å using the plasma CVD method or the reduced-pressure thermal CVD method. After the amorphous silicon film has been formed, nickel, which is a metal element which promotes crystallization, is introduced onto the amorphous silicon film. Here, nickel is brought into contact with and maintained on the surface of the amorphous silicon film by applying a nickel acetate solution to the surface of the amorphous silicon film by a spin coating method. A crystalline silicon film is obtained by heat treating for 4 hours at 550° C. Irradiating with laser light or strong light after the thermal crystallization is advantageous in improving the crystallinity of the silicon film.

Figure 1A:
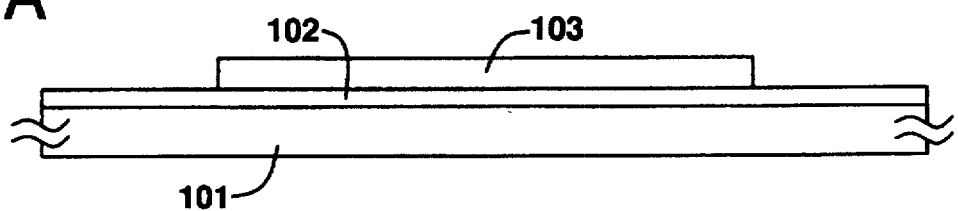
FIGS. 1A–1D are diagrams showing a manufacturing process of a TFT in accordance with a first embodiment of the present invention.

The active layer 103 of the thin-film transistor is then formed by performing patterning. (FIG. 1A)

Figure 1B:
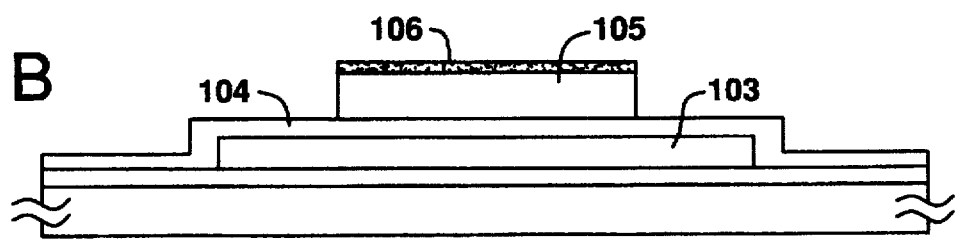

A silicon oxide film 104 which functions as a gate insulating film is then formed covering the active layer 103 to a thickness of 1000 Å by the plasma CVD method. An aluminum film 105 with a thickness of 6000 Å is then formed by the electron beam vacuum evaporation method or the sputtering method. Between 1 and 5 wt % or between 0.1 and 5 wt % of scandium is included in the aluminum film. Having formed the aluminum film 105, an anodic oxide film 106 of between approximately 50 and 100 Å is formed on the surface thereof. The anodic oxidation is performed in an ethylene glycol solution containing between 3 and 10% of tartaric acid, using the aluminum film as the anode. Here, anodic oxidation is performed with an applied voltage of between 100 and 200 V, for example 150 V. As a result, a dense barrier-type anodic oxide film 106 is formed. Patterning of the aluminum film is then performed using a photoresist, and the state shown in FIG. 1B is obtained. This dense barrier-type anodic oxide film 106 has an important role in ensuring that when, subsequently, a porous oxide layer (indicated by 107 in FIG. 1C) is formed, the oxide layer 107 only grows in the horizontal direction (in other words only on the side surfaces of the gate electrode).

Figure 1C:
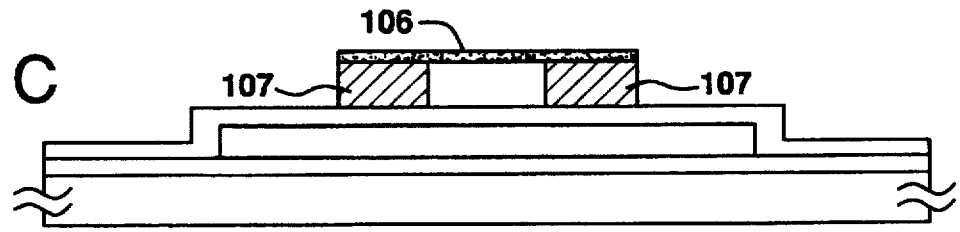

Next, the porous oxide layer 107 is formed to a thickness of between 3000 Å and 1 μm, for example 5000 Å, by performing anodic oxidation in a citric acid or nitric acid solution of between 3 and 20%. Here, the anodic oxidation is performed in a 10% nitric acid solution at 30° C., by applying a voltage of 10 V for 5 minutes. Thus the state shown in FIG. 1C is obtained.

Figure 1D:
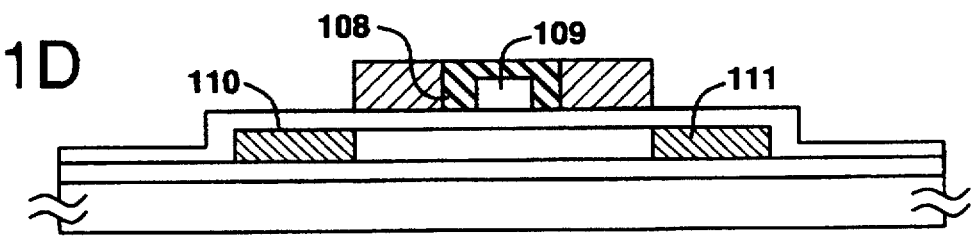
Figure 4A:
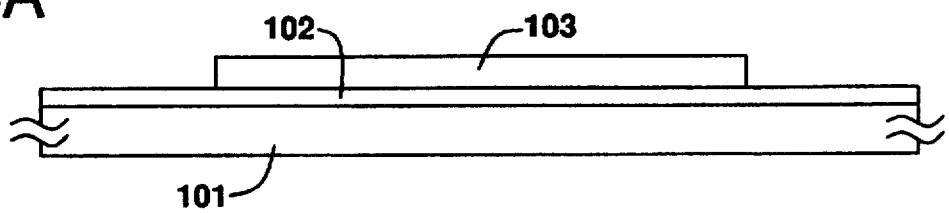
FIGS. 4A–4D show a manufacturing process of a TFT in accordance with the present invention.
Figure 4B:
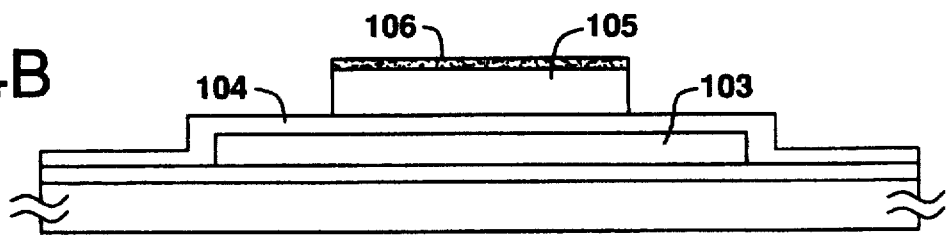
Figure 4C:
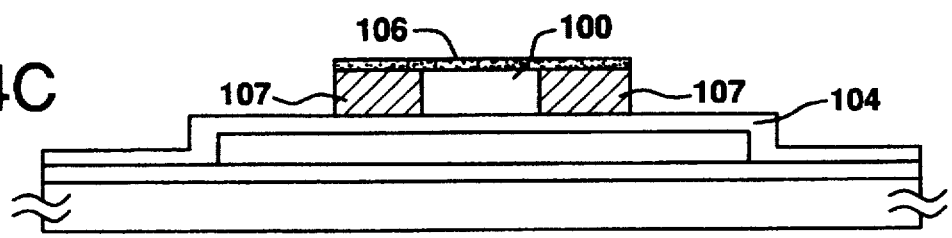
Figure 4D:
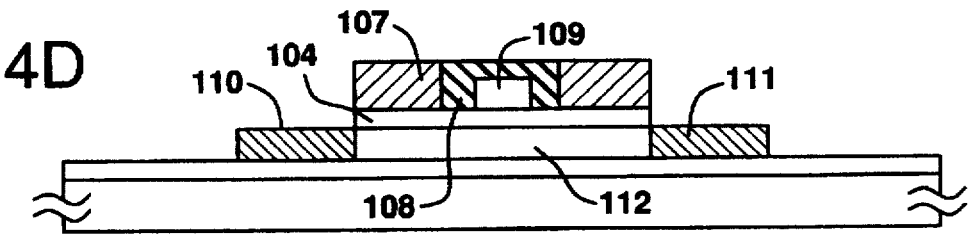
Figure 5A:
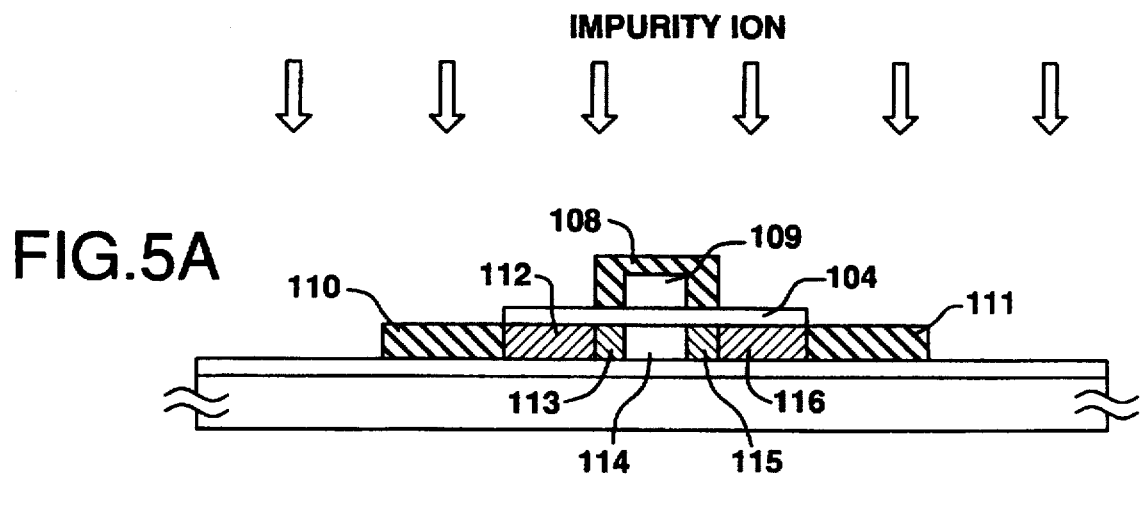
FIGS. 5A and 5B show a manufacturing process of a TFT in accordance with the present invention.
Figure 5B:
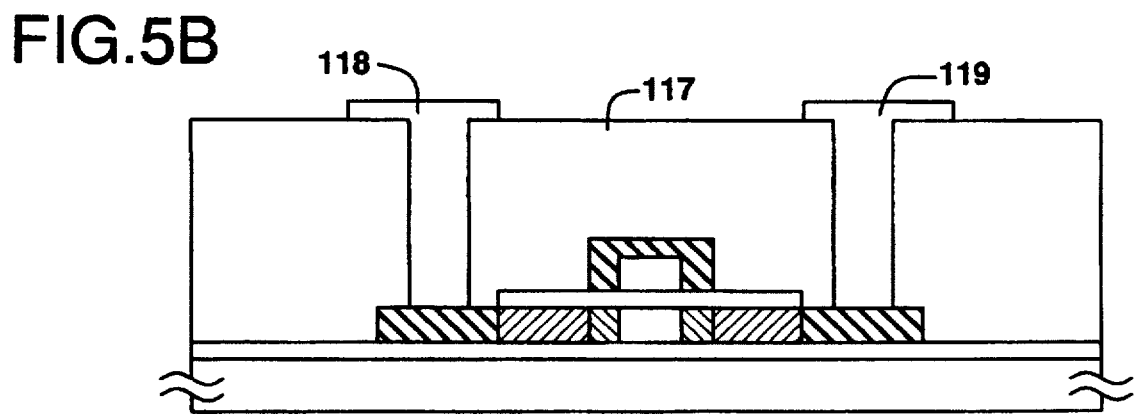
Figure 6:
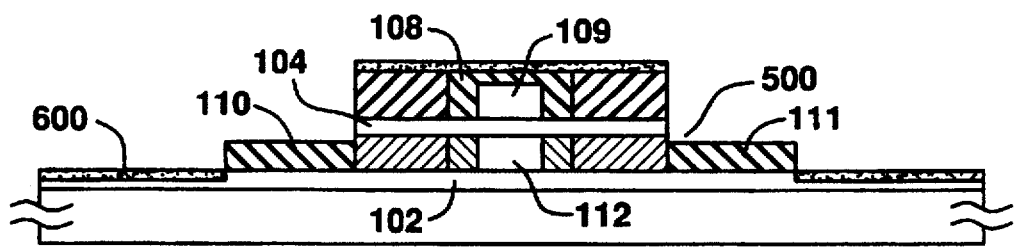
FIG. 6 is a cross sectional view for showing a thin film transistor.
Figure 7:
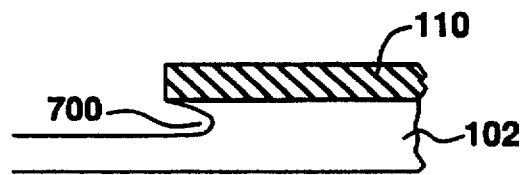
FIG. 7 is a partial enlarged view of a thin film transistor.

The dense anodic oxide film 106 is then removed, and a dense anodic oxide layer 108 is formed by once again performing anodic oxidation in an ethylene glycol solution containing tartaric acid. The thickness of the oxide layer is 2000 Å. This oxide layer is used as a mask to form the offset gate regions in the subsequent impurity ion implantation process. Further, by performing the above mentioned oxide layer 108, a gate electrode 109 whose main component is aluminum is formed. (FIG. 1D)

The active layer is then subjected to an impurity ion implantation, with the porous oxide layer 107, the dense oxide layer 108 and the gate electrode 109 as a mask. Here, phosphorus ions are implanted in order to fabricate an n-channel type thin-film transistor. The phosphorus ion implantation is performed with a dose of between $1\times10^{14}$ and $1\times10^{15}$ cm$^{-2}$, for example $5\times10^{14}$ cm$^{-2}$. In this process, the regions indicated by 110 (which will be the source region) and 111 (which will be the drain region) are subjected to the phosphorus ion implantation.

The porous oxide layer 107 is then removed using a mixture of phosphoric acid, acetic acid and nitric acid.

Phosphorus ion implantation is once again performed. Here, the phosphorus ion implantation is performed with a dose of between $5\times10^{12}$ and $5\times10^{13}$ cm$^{-2}$, for example $1\times10^{13}$ cm$^{-2}$. The source region 110 and the drain region 111 are again subjected to the phosphorus ion implantation in this process. Further, the regions indicated by 112 and 116 are lightly doped with phosphorus ions, and are formed in two lightly doped regions. Further, the regions indicated by 113 and 115 are not subjected to ion implantation since the oxide layer 108 acts as a mask, and they are formed into offset gate regions. Further, 114 becomes a channel-forming region. After ion implantation has been completed annealing is performed by heating or irradiating with laser light or by irradiating with strong light. Thus the source region 110, the drain region 111, the lightly doped regions 112 and 116, the offset gate regions 113 and 115, and the channel-forming region 114 are formed. (FIG. 2A)

A silicon oxide film 117 is then formed as an inter-layer insulating film to a thickness of 6000 Å by the plasma CVD method. A hole-making process is then performed and a source electrode 118 and a drain electrode 119 are formed. Finally, hydrogen treatment is performed for one hour in a hydrogen atmosphere at 350° C., thus completing the thin-film transistor.

When the construction shown in the present embodiment is adopted, it is possible to form offset gate regions and lightly doped regions without forming steps in the active layer. It is also possible to solve problems such as the buffer silicon oxide film being etched. It is thus possible to obtain a thin-film transistor which has stable characteristics.

[Embodiment 2]

This embodiment is a modification of the Embodiment 1. After the step shown in FIG. 2A of the first embodiment, the exposed portion of the silicon oxide film 104 is removed, following which the silicon oxide film 117 which is an inter-layer insulating film, and the source electrode 118 and the drain electrode 119 are formed as shown in FIG. 3. In this case, since the silicon oxide film 104 which has been subjected to significant damage by the ion implantation is removed, it is possible to avoid adverse effects or deterioration of properties resulting from the damaged silicon oxide film.

[Embodiment 3]

Figure 8A:
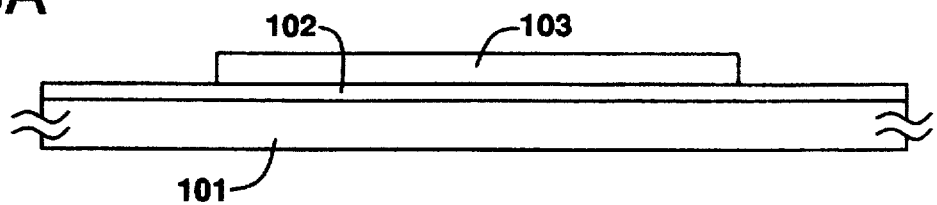
FIGS. 8A–8D show a manufacturing process of a TFT in accordance with a third embodiment of the present invention.

The present embodiment is directed to another method of forming a TFT having lightly doped regions between the channel-forming region and the source/drain regions and will be described in conjunction with FIGS. 8A–8D and FIGS. 9A and 9D. Initially, a buffer silicon oxide film is formed to a thickness of 2000 Å on a glass substrate 101. An amorphous silicon film is then formed to a thickness of between 100 and 1000 Å, for example 500 Å, by the plasma CVD method or the reduced-pressure thermal CVD method. A solution containing nickel is then brought into contact with and maintained on the amorphous silicon film by a spin coating method using nickel acetate. A crystalline silicon film is then obtained by heat treating for 4 hours at 550° C. An active layer 103 comprising a crystalline silicon film is then obtained by patterning the crystalline silicon film. It should be noted that irradiating with laser light after the thermal crystallization is effective in improving the crystallinity. (FIG. 8A)

Figure 8B:
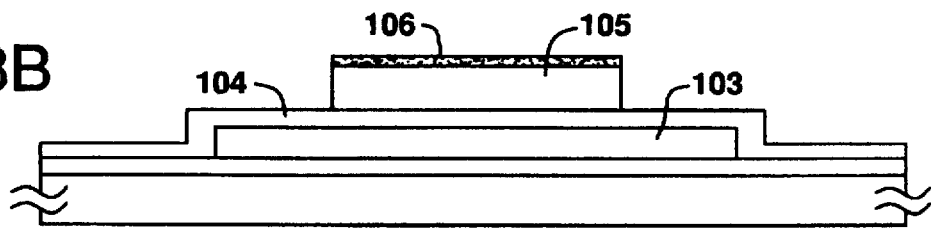

Next, referring to FIG. 8B, a silicon oxide film 104 which functions as a gate-insulating film is formed to a thickness of 1000 Å by the plasma CVD method, and further a film whose main component is aluminum, containing 0.18% scandium, is formed to a thickness of 5000 Å. A dense anodic oxide film 106 is then formed by performing anodic oxidation in a citric acid solution of between 3 and 20%. An island-shaped region 105 is then formed by patterning the film whose main component is aluminum.

Figure 8C:
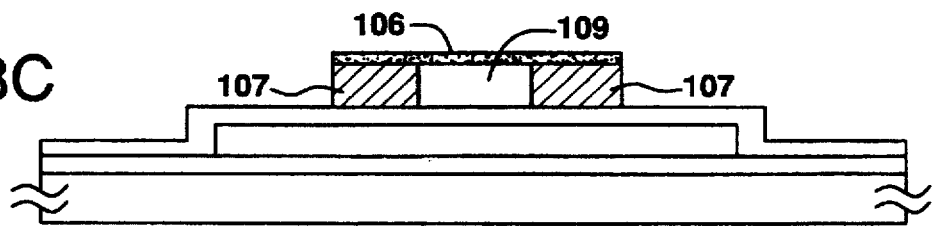

The porous oxide layer 107 is then formed by performing anodic oxidation in an acidic electrolyte solution containing between 3 and 20% of nitric acid, using the island-shaped region 105 whose main component is aluminum as the anode. Here, the oxide layer 107 is grown to a length of 0.5 μm by applying a voltage of between approximately 10 and 30 V. The growth distance of the oxide layer may be controlled to an arbitrary length (maximum approximately 3 μm). Further, a gate electrode 109 is formed in this process. (FIG. 8C)

Figure 8D:
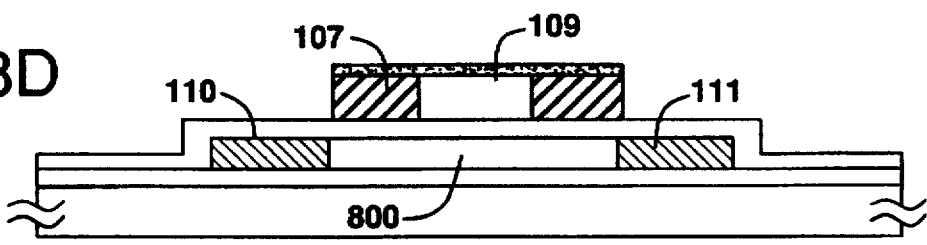

Source, drain regions are then formed by impurity ion implantation. Here, a source region 110 and a drain region 111 are formed by performing phosphorus ion implantation. The phosphorus ion implantation is performed at a dose of approximately $4 \times 10^{14}$ cm$^{-2}$. This process is performed with the porous oxide layer 107 and the gate electrode 109 as a mask. (FIG. 8D)

The porous oxide layer 107 is then removed using a mixture of phosphoric acid, acetic acid and nitric acid. Phosphorus ion implantation is then once again performed at a dose of $2 \times 10^{13}$ cm$^{-2}$. As a result, the regions indicated by 112 and 116 in FIG. 9A are formed in a self-aligning manner as lightly doped regions.

A silicon oxide film 117 is then formed as an inter-layer insulating film to a thickness of 6000 Å by the plasma CVD method, and a hole-opening process is then performed, and a source electrode 118 and a drain electrode 119 are formed. These electrodes should be formed from aluminum or another suitable metal. Finally, heat treatment is performed for 1 hour in a hydrogen atmosphere at 350° C., thereby completing the thin-film transistor as shown in FIG. 9B.

[Embodiment 4]

Figure 10:
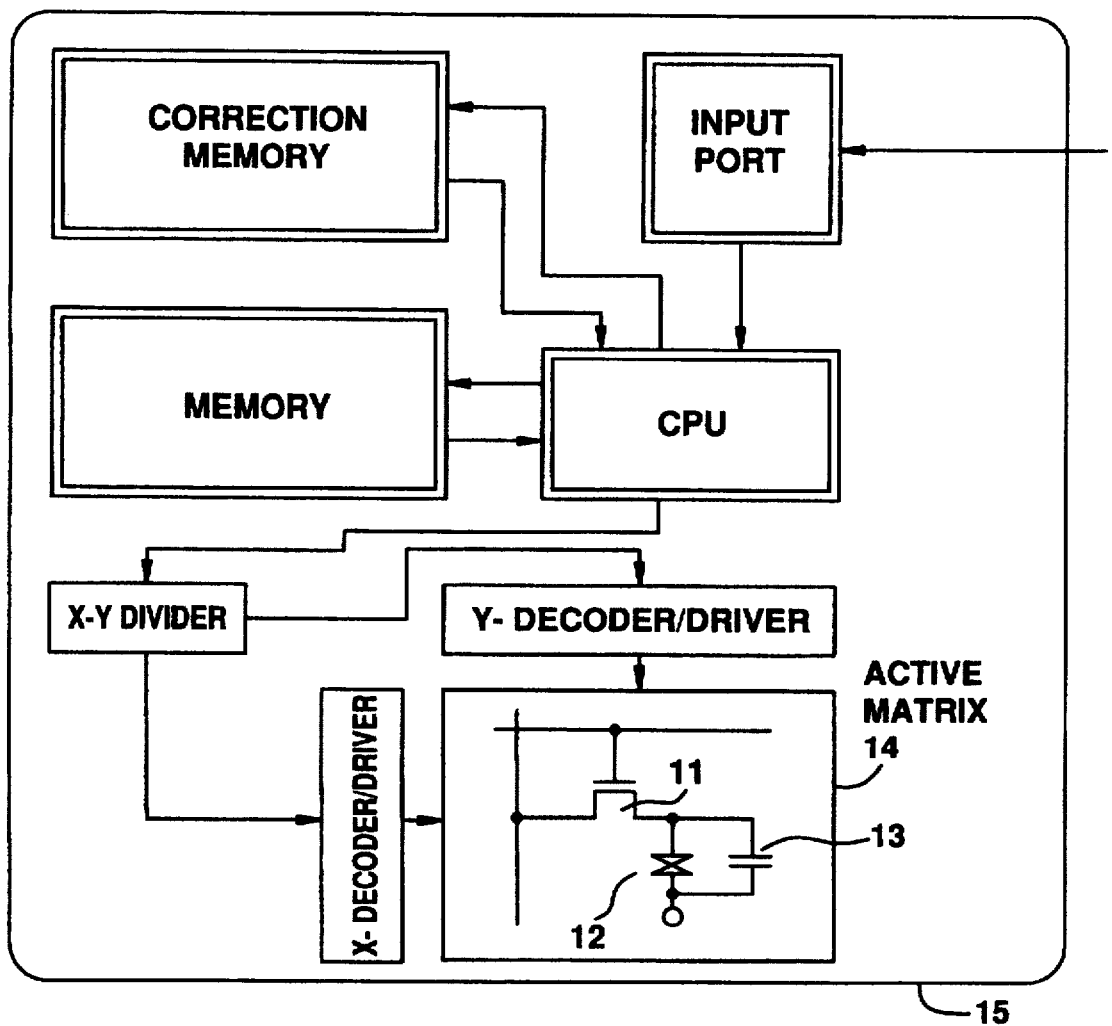
FIG. 10 is a plan view showing a monolithic active matrix liquid crystal device in accordance with the present invention.

FIG. 10 shows an example of a higher-performance active matrix-type liquid crystal display system in accordance with the present invention. The example in FIG. 10 is an example in which the size, weight and thickness are reduced by mounting a semiconductor chip which is normally attached to the main board of a computer onto at least one of a pair of substrates of a liquid crystal display which has a construction in which liquid crystal is held between the pair of substrates.

An explanation will now be given of FIG. 10. A substrate 15 is a substrate of a liquid-crystal display, and an active matrix circuit 14 in which are formed a large number of picture elements which are provided with a TFT 11, a picture element electrode 12 and an auxiliary capacitor 13, and an X decoder/driver, a Y decoder/driver and an XY branching circuit for driving the active matrix circuit 14 are formed on the substrate 15 using TFTs formed in accordance with the present invention.

Other chips are also attached to the substrate 15. These chips are connected to circuits on the substrate 15 by a means such as a wire bonding method or a COG (Chip On Glass) method. In FIG. 10, the correction memory, memory, CPU and input board are chips which are attached in this way, and various other chips may also be attached.

In FIG. 10, the input port is a circuit which reads signals input from outside and converts them into image signals. The correction memory is specific to the active matrix signal and is used to correct input signals and the like to match the properties of the active matrix panel. In particular, this correction memory contains information specific to each picture element as nonvolatile memory, and corrects each picture element individually. Specifically, if there is a point defect in a picture element of an electro-optical device then corrected signals which match this are sent to picture elements at the periphery of the point, thereby covering the defect and rendering the defect unnoticeable. Further, if a picture element is darker than picture elements at its periphery, the greater signal is sent to that picture element such that its brightness is the same as the picture elements at its periphery. Since information relating to defects of picture elements is different for each panel, the information stored in the correction memory will be different for each panel.

The CPU and memory are the same as, and have the same function as those in a normal computer, and in particular the memory comprises image memory corresponding to each picture element, as RAM. All of these types are of the CMOS type. It is also possible to construct at least part of the required integrated circuitry using the inventions disclosed in the present specification, thereby further improving the thin film of the system.

As outlined above, forming even a CPU and memory on a liquid crystal display substrate, and constructing an electronic device such as a simple personal computer on a single substrate, are extremely advantageous in reducing the size of a liquid crystal display system and increasing its scope of application.

What is claimed is:

1. A method for manufacturing a semiconductor device comprising the steps of:

forming a semiconductor layer over a substrate;

forming an insulating layer on said semiconductor layer;

forming a gate electrode comprising an anodizable material on said insulating film;

forming an anodic oxide film on side surfaces of said gate electrode by oxidizing the side surfaces;

introducing an impurity into said semiconductor layer with said anodic oxide film used as a mask at a first concentration to form a pair of heavily doped regions within said semiconductor layer;

removing said anodic oxide film after the formation of said heavily doped regions; and then introducing said impurity into said semiconductor layer with said gate electrode used as a mask at a second concentration to form a pair of lightly doped regions adjacent to said heavily doped regions, whereby a channel region is defined between said lightly doped regions within said semiconductor layer.

wherein said channel region extends beyond the side edges of said gate electrode to provide a pair of offset regions.

2. The method of claim 1 wherein said gate electrode comprises aluminum.

3. The method of claim 2 wherein said oxide is formed by anodizing a surface of said gate electrode.

4. The method of claim 3 wherein said surface is anodized in an acid solution containing citric acid, nitric acid, phosphoric acid, chromic acid, sulfuric acid and a mixture thereof.

5. The method of claim 1 wherein said insulating layer covers an entire surface of said semiconductor layer and said impurity is introduced through said insulating layer.

6. A method of manufacturing a semiconductor device comprising the steps of:

forming a semiconductor layer over a substrate;

forming an insulating layer on said semiconductor layer;

forming a gate electrode comprising an anodizable material on said insulating layer;

forming a first anodic oxide film on side surfaces of said gate electrode;

forming a second anodic oxide film between said first anodic oxide film and the side surfaces of said gate electrode after the formation of said first anodic oxide film, said second anodic oxide film being denser than said first anodic oxide film;

performing a first ion doping with said first and second anodic oxide films and said gate electrode used as a mask to form a pair of heavily doped regions within said semiconductor layer;

removing said first anodic oxide film; and then performing a second ion doping with said gate electrode and said second anodic oxide film used as a mask to form a pair of lightly doped regions adjacent to said heavily doped regions.

7. The method of claim 6 wherein said first anodic oxide film is formed by anodizing a surface of said gate electrode in an acid solution containing citric aid, nitric acid, phosphoric acid, chromic acid, sulfuric acid and a mixture thereof, and wherein said second anodic oxide film is formed by anodizing a surface of said gate electrode in an ethylene glycol solution containing tartaric acid, boric acid, nitric acid and mixture thereof.

8. A method according to claim 6 wherein said first ion doping is performed through said insulating layer.

9. A method of manufacturing an active matrix device comprising an active matrix circuit, a driver circuit for driving said active matrix circuit and a CPU on a single substrate, said method comprising the steps of:

forming a semiconductor layer over said substrate;

forming an insulating layer on said semiconductor layer;

forming a gate electrode comprising an anodizable material on said insulating layer;

forming a first anodic oxide film on side surfaces of said gate electrode;

forming a second anodic oxide film between said first anodic oxide film and the side surfaces of said gate electrode after the formation of said first anodic oxide film, said second anodic oxide film being denser than said first anodic oxide film;

performing a first ion doping with said first and second anodic oxide films and said gate electrode used as a mask to form a pair of heavily doped regions within said semiconductor layer;

removing said first anodic oxide film; and then performing a second ion doping with said gate electrode and said second anodic oxide film used as a mask to form a pair of lightly doped regions adjacent to said heavily doped regions.

10. The method of claim 9 wherein said first anodic oxide film is formed by anodizing a surface of said gate electrode in an acid solution containing citric aid, nitric acid, phosphoric acid, chromic acid, sulfuric acid and a mixture thereof, and wherein said second anodic oxide film is formed by anodizing a surface of said gate electrode in an ethylene glycol solution containing tartaric acid, boric acid, nitric acid and mixture thereof.

11. A method according to claim 9 wherein said first ion doping is performed through said insulating layer.

* * * * *